United States Patent [19]
Dobkin et al.

[11] 4,176,308
[45] Nov. 27, 1979

[54] VOLTAGE REGULATOR AND CURRENT REGULATOR

[75] Inventors: Robert C. Dobkin, Hillsborough; Robert A. Pease, San Francisco, both of Calif.

[73] Assignee: National Semiconductor Corporation, Santa Clara, Calif.

[21] Appl. No.: 835,243

[22] Filed: Sep. 21, 1977

[51] Int. Cl.² ............................ G05F 1/58; G05F 1/60
[52] U.S. Cl. ........................................ 323/4; 307/297; 307/303; 323/9; 323/19; 323/22 T
[58] Field of Search .......................... 323/1, 4, 8, 9, 19, 323/22 T; 307/296, 297, 303

[56] References Cited

U.S. PATENT DOCUMENTS

| | | | |
|---|---|---|---|
| 3,617,859 | 11/1971 | Dobkin et al. | 323/4 |
| 3,851,241 | 11/1974 | Wheatley, Jr. | 323/19 |
| 3,887,863 | 6/1975 | Brokaw | 323/22 T |
| 3,962,592 | 6/1976 | Thommen et al. | 323/4 |
| 3,976,896 | 8/1976 | Ryder | 323/22 T |
| 3,995,304 | 11/1976 | Pease | 307/303 |
| 4,017,788 | 4/1977 | Stepp et al. | 323/22 T |
| 4,068,134 | 1/1978 | Tobey, Jr. et al. | 323/22 T |
| 4,071,813 | 1/1978 | Dobkin | 323/8 |
| 4,074,181 | 2/1978 | Crowle | 323/19 |
| 4,079,308 | 3/1978 | Brown | 323/1 |
| 4,100,436 | 7/1978 | van de Plassche | 307/229 |
| 4,100,478 | 7/1978 | Tam | 323/22 T |

OTHER PUBLICATIONS

Nat. Semi-Conductor Corp. Application Note: AN-42, Feb. 1971, "IC Provides On-Card Regulation for Logic CK7S" by Widlar.
Nat. Semi-Conductor Corp. Application Note: AN-56, Dec. 1971, "1.2 Volt Reference" by R. C. Dobkin.
*Linear Data Book* Nat. Semi-Conductor Corp., 1976, pp. 1-15, 1-22, Application Note: LM 117/LM 217/LM 317.
Nat. Semi-Conductor Appl. Note: AN-178, Jan. 1978, "Applications for Adjustable IC Power Regulator" by Dobkin.

*Primary Examiner*—Gerald Goldberg
*Attorney, Agent, or Firm*—Brown & Martin

[57] ABSTRACT

A voltage regulator including a current regulator for maintaining predetermined currents in the voltage regulator is disclosed. The voltage regulator includes an output terminal for providing an output voltage; an adjustment terminal; and a control circuit connected to the output terminal at a level that differs from the voltage at the adjustment terminal by a predetermined voltage difference. The control circuit of the voltage regulator includes a resistive divider coupled between the output terminal and the adjustment terminal; a pair of transistors having their collectors connected in common and their bases respectively coupled to the resistive divider to provide a portion of the voltage difference between the output terminal and the adjustment terminal across their bases. The two transistors are adapted for operating at different current densities for providing a predetermined ratio in current flow through the pair of transistors when the voltage difference between the output terminal and the adjustment terminal is the predetermined voltage difference. The control circuit further includes a high-gain amplifier circuit connected to the emitters of the pair of transistors and to the output terminal for driving the output terminal to a maintained voltage level at which the current flow through the pair of transistors is at the predetermined current ratio and the voltage difference between the output terminal and the adjustment terminal is the predetermined voltage difference. The disclosed voltage regulator is useful as a negative voltage regulator.

20 Claims, 7 Drawing Figures

VOLTAGE REGULATOR AND CURRENT REGULATOR

BACKGROUND OF THE INVENTION

The present invention generally pertains to voltage regulators and is particularly directed to an improvement in the type of voltage regulator which is useful as a negative voltage regulator. It is desired to provide a negative voltage regulator which may be operated from a low negative input voltage source, with good dynamic response and stability. It is particularly desirable that stability be maintained with respect to variations in temperature.

The present invention further pertains to a current regulator for maintaining a plurality of predetermined currents for the voltage regulator.

SUMMARY OF THE INVENTION

The present invention provides an improvement to a voltage regulator of the type including an output terminal for providing an output voltage; an adjustment terminal; and a control circuit connected to the output terminal and the adjustment terminal for maintaining the voltage at the output terminal at a level that differs from the voltage at the adjustment terminal by a predetermined voltage difference. The voltage regulator of the present invention is characterized by the control circuit including a resistive divider coupled between the output terminal and the adjustment terminal; a pair of transistors having their collectors connected in common and their bases respectively coupled to the resistive divider to provide a portion of the voltage difference between the output terminal and the adjustment terminal across their bases, wherein the two transistors are adapted for operating at different current densities for providing a predetermined ratio in current flow through the pair of transistors when the voltage difference between the output terminal and the adjustment terminal is the predetermined voltage difference; and a high-gain amplifier circuit connected to the emitters of the pair of transistors and to the output terminal for driving the output terminal to a maintained voltage level at which the current flow through the pair of transistors is at the predetermined current ratio and the voltage difference between the output terminal and the adjustment terminal is the predetermined voltage difference.

Because of the difference in current density in the pair of transistors, there is an inherent emitter to base voltage difference $\Delta V_{be}$ between the bases of the pair of transistors that is proportional to temperature. The voltage regulator of the present invention preferably further includes a device having a negative temperature coefficient connected in series with the resistive divider between the adjustment terminal and the output terminal for balancing the positive temperature coefficient of the voltage difference $\Delta V_{be}$ of the pair of transistors.

To provide additional stability in the voltage regulator with respect to variations in temperature, the voltage regulator of the present invention preferably consists of an integrated circuit in which the pair of transistors and the device having a negative temperature coefficient have a common center of distribution.

Another feature of the voltage regulator of the present invention is a unique high-gain amplifier circuit that is included in a preferred embodiment wherein the pair of transistors are NPN transistors. This high-gain amplifier circuit includes a pair of PNP transistors having their bases connected in common and their emitters respectively connected to the emitters of the pair of NPN transistors, wherein the pair of PNP transistors are adapted for operating at the same current density; and an amplifier connected to the collectors of the pair of PNP transistors for amplifying the difference in current flow in the pair of PNP transistors to drive the output terminal to the maintained voltage level.

The voltage regulator of the present invention is further characterized by a current regulator for maintaining a predetermined current for the voltage regulator. The current regulator includes first and second terminals for connection across a voltage source; a plurality of commonly driven source transistors having their bases coupled in common and their emitters coupled to the first terminal; a transistor pair, a current defining resistance; and a control transistor. The first transistor of the transistor pair has its emitter connected to the second terminal and its base connected to its collector, and the second transistor of the pair has its base connected to the collector of the first transistor. The first transistor is adapted for operating at a greater current density than the second transistor, whereby there is a predetermined voltage difference $\Delta V_{be}$ between the emitters of the transistor pair. The current defining resistance is connected between the emitter of the second transistor and the second terminal for defining a predetermined current through the second transistor proportional to the predetermined voltage difference $\Delta V_{be}$. The control transistor has its collector coupled to the bases of the commonly driven source transistors, its emitter connected to the collector of the second transistor and its base biased with respect to either the first or second terminal for controlling the base current of the commonly driven source transistors. One of the source transistors has its collector coupled to the collector of the second transistor for maintaining the predetermined currents from the collectors of each of the commonly driven source transistors.

Additional features of the present invention are described with reference to the description of the preferred embodiment.

DESCRIPTION OF THE PREFERRED EMBODIMENT

Figure 1:
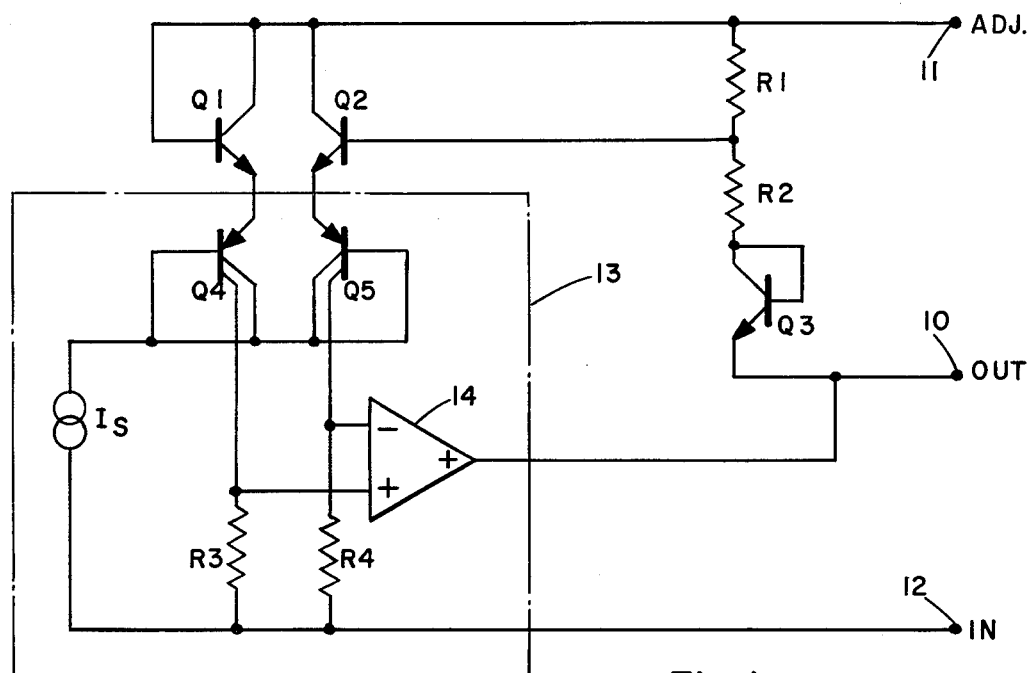
FIG. 1 is a schematic circuit diagram of one preferred embodiment of the voltage regulator of the present invention.

One preferred embodiment of a voltage regulator according to the present invention is shown in FIG. 1. In this embodiment, the voltage regulator includes an output terminal 10 for providing an output voltage; an adjustment terminal 11; and input terminal 12 for connection to a power source; and a control circuit connected to the output terminal 10 and the adjustment terminal 11 for maintaining the voltage at the output terminal 10 at a level that differs from the voltage at the adjustment terminal 11 by a predetermined voltage difference. The adjustment terminal 11 is for connection to a voltage source that is positively biased with respect to the output terminal 10.

The control circuit includes a resistive divider including resistances R1 and R2 coupled between the output terminal 10 and the adjustment terminal 11; a pair of transistors Q1 and Q2 and a high-gain amplifier circuit 13.

The pair of transistors Q1 and Q2 have their collectors connected in common and their bases respectively connected to the resistive divider R1, R2 to provide a portion of the voltage difference between the output terminal 10 and the adjustment terminal 11 across their bases. The two transistors Q1 and Q2 are adapted for operating at different current densities for providing a predetermined ratio in current flow through the pair of transistors Q1 and Q2 when the voltage difference between the output terminal 10 and the adjustment terminal 11 is the predetermined voltage difference.

The high-gain amplifier circuit 13 is connected to the emitters of the pair of transistors Q1, Q2 and to the output terminal 10 for driving the output terminal 10 to a maintained voltage level at which the current flow through the pair of transistors Q1, Q2 is at the predetermined current ratio and the voltage difference between the output terminal 10 and the adjustment terminal 11 is the predetermined voltage difference.

Because of the difference in current density in the pair of transistors Q1, Q2, there is an inherent emitter to base voltage difference $\Delta V_{be}$ between the bases of the pair of transistors Q1, Q2 that is proportional to temperature.

A transistor Q3 having a negative temperature coefficient is connected in series with the resistive divider R1, R2 between the adjustment terminal 11 and the output terminal 10 for balancing the positive temperature coefficient of the voltage difference $\Delta V_{be}$ of the pair of transistors Q1, Q2.

In the voltage regulator of FIG. 1, the pair of transistors Q1, Q2 are NPN transistors; and the high-gain amplifier circuit 13 includes an operational amplifier 14 and a pair of PNP transistors Q4, Q5. The pair of PNP transistors Q4, Q5 have their bases connected in common and their emitters respectively connected to the emitters of the pair of NPN transistors Q1, Q2. The pair of PNP transistors Q4, Q5 are adapted for operating at the same current density.

The operational amplifier 14 is connected to the collectors of the pair of PNP transistors Q4, Q5 for amplifying the difference in the current flow in the pair of PNP transistors Q4, Q5 to drive the output terminal 10 to the maintained voltage level.

The voltage regulator of FIG. 1 further includes a current source $I_s$ and current defining resistors R3 and R4.

Figure 2:
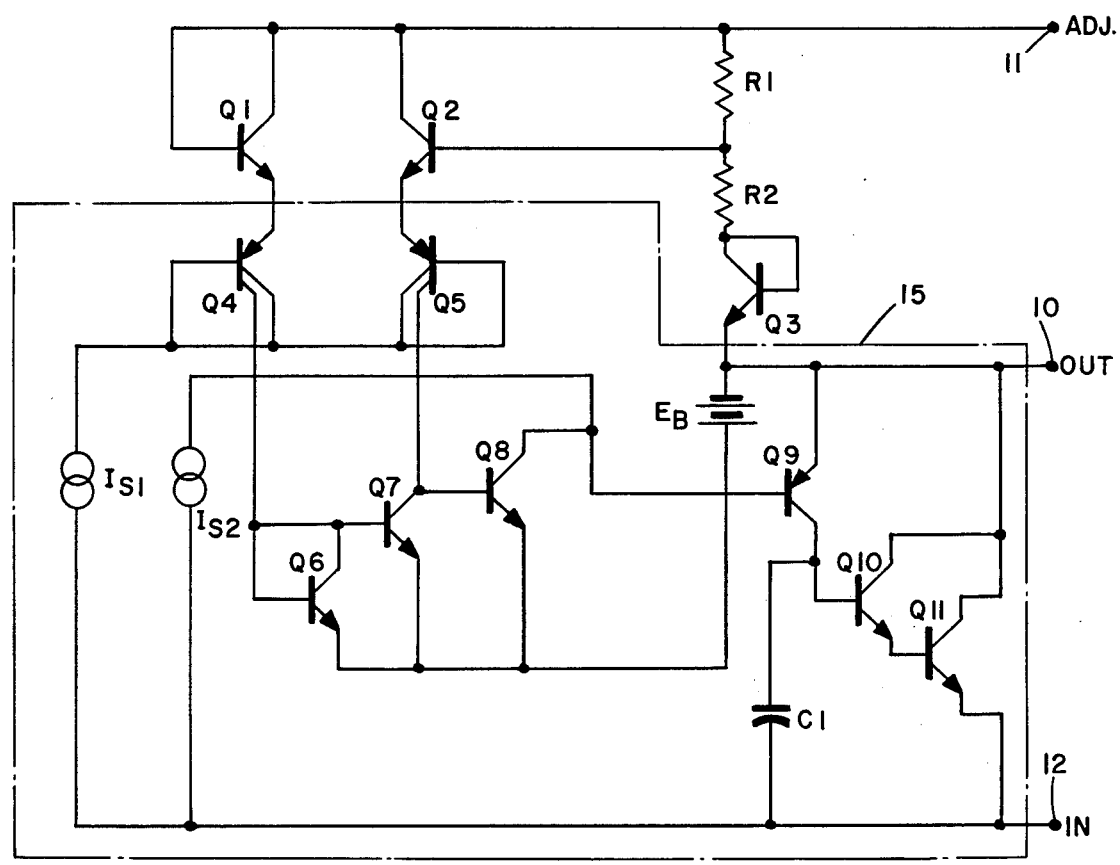
FIG. 2 is a schematic circuit diagram of a second preferred embodiment of the voltage regulator of the present invention.

A second preferred embodiment of a voltage regulator according to the present invention is shown in FIG. 2. The voltage regulator of 2 includes an output terminal 10, an adjustment terminal 11, and input terminal 12, a resistive divider R1, R2, a pair of NPN transistors Q1, Q2 and a transistor Q3 having a negative temperature coefficient; all of which are interconnected and provide the same functions as the like identified components in the voltage regulator of FIG. 1.

The voltage regulator of FIG. 2 differs from the voltage regulator of FIG. 1 by virtue of the high-gain amplifier circuit 15. The high-gain amplifier circuit 15 includes a pair of PNP transistors Q4 and Q5; third, fourth and fifth NPN transistors Q6, Q7 and Q8; a third PNP transistor Q9. and an output stage including NPN transistors Q10 and Q11.

The pair of PNP transistors Q4, Q5 have their bases connected in common and their emitters respectively connected to the emitters of the pair of NPN transistors Q1, Q2. The pair of PNP transistors Q4, Q5 are adapted for operating at the same current density.

The third NPN transistor Q6 has its connector connected to one of the collectors of the PNP transistor Q4 that is connected to the NPN transistor Q1 of the pair of NPN transisotrs Q1, Q2 that has the greater current density. The third NPN transistor Q6 has its base connected to its collector.

The fourth NPN transistor Q7 has its collector connected to one of the collectors of the PNP transistor Q5 that is connected to the NPN transistor Q2 of the pair of NPN transistors Q1, Q2 that has the lesser current density. The fourth NPN transistor Q7 has its base connected to the collector of the third NPN transistor Q6. The second collectors of the PNP transistors Q4 and Q5 are connected to each other and to the bases of the transistors Q4 and Q5.

The fifth NPN transistor Q8 has its base connected to the collector of the fourth NPN transistor Q7 and its emitter connected to the emitter of the fourth NPN transistor Q7.

The third PNP transistor Q9 has its base coupled to the collector of the fifth NPN transistor Q8 and its emitter coupled to the output terminal 10.

A biasing circuit $E_B$ is connected to the output terminal 10 for biasing the emitters of the third, fourth and fifth NPN transistors Q6, Q7, Q8 in common in relation to the output terminal 10 for enabling a current flow through the third PNP transistor Q9 that is proportional to the difference in current flow through the pair of PNP transistors Q4, Q5.

The output stage including NPN transistors Q10 and Q11 is connected between the output terminal 10 and the input terminal 12 and to the collector of the third PNP transistor Q9 for amplifying the current through the third PNP transistor Q9 to drive the output terminal 10 to the maintained voltage level at which the current flow through the pair of NPN transistors Q1, Q2 is at the predetermined current ratio and the voltage difference between the output terminal 10 and the adjustment terminal 11 is the predetermined voltage difference.

The voltage regulator of FIG. 2 further includes a capacitance C1 connected between the collector of the third PNP transistor Q9 and the input terminal 12, for providing high frequency stability; and a pair of current sources $I_{s1}$ and $I_{s2}$.

Figure 3:
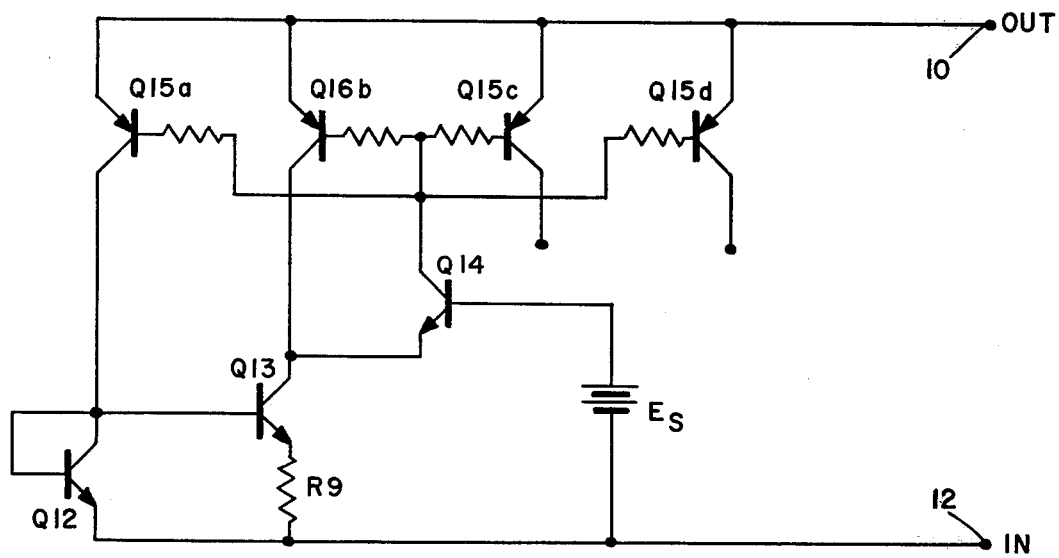
FIG. 3 is a schematic circuit diagram of one preferred embodiment of the current regulator of the present invention.

One preferred embodiment of a current regulator for maintaining a predetermined current in accordance with the present invention is shown in FIG. 3. The current regulator of FIG. 3 includes first and second terminals 10 and 12 for connection across a voltage source; a transistor pair Q12 and Q13; a current defining resistance R9; a control transistor Q14; and a plurality of commonly driven source transistors Q15a, 16b, 15c and 15d having their emitters coupled to the first terminal 10.

The first transistor Q12 of the pair has its emitter connected to the second terminal 12 and its base connected to its collector. The second transistor Q13 of the pair has its base connected to the collector of the first transistor Q12. The first transistor Q12 is adapted for operating at a greater current density than the second transistor Q13, whereby there is a predetermined voltage difference $\Delta V_{be}$ between the emitters of the transistor pair Q12, Q13.

The current defining resistance R9 is connected between the emitter of the second transistor Q13 and the second terminal 12 for defining a predetermined voltage difference $\Delta V_{be}$.

The control transistor Q14 has its collector coupled to the bases of the commonly driven source transistor Q15a, 16b, 15c, and 15d, its emitter connected to the collector of the second transistor Q13 and its base biased with respect to the second terminal 12 by a biasing circuit $E_s$, for controlling the base current of the commonly driven source transistors Q15a, Q16b, Q15c, Q15d.

One of the source transistors Q16b has its collector coupled to the collector of the second transistor Q13 for maintaining the predetermined currents from the collectors of each of the commonly driven source transistors Q15a, Q16b, Q15c, Q15d.

Figure 4:
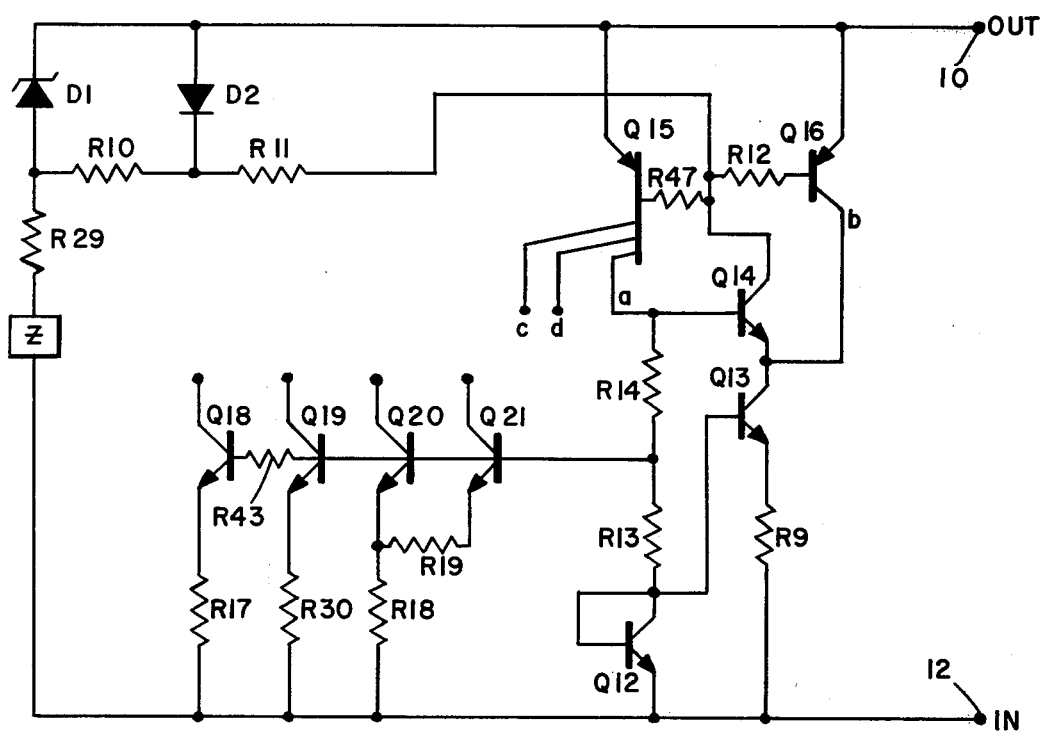
FIG. 4 is a schematic circuit diagram of a second preferred embodiment of the current regulator of the present invention.

A second preferred embodiment of the current regulator of the present invention is shown in FIG. 4. This embodiment of the current regulator also includes a plurality of commonly driven source transistors Q15a, c, and d, and Q16b; a transistor pair Q12 and Q13, a current defining resistance R9 and a control transistor Q14. These components are interconnected and provide the same functions as the like identified components in the current regulator of FIG. 3.

In the current regulator of FIG. 4 the plurality of commonly driven source transistors is provided by PNP transistor Q16 and a plurality of collectors a, c and d of the PNP transistor Q15; the transistor pair Q12, Q13 are NPN transistors; and the control transistor Q14 is an NPN transistor. The base of the control transistor Q14 is biased with respect to the second terminal 12 by a bias circuit including resistances R14 and R13.

The control transistor Q14 has its collector coupled to the bases of the commonly driven source transistors Q15 and Q16, and its emitter connected to the collector of the second transistor Q13, for controlling the base current of the commonly driven source transistors Q15 and Q16. One of the source transistors Q16 has its collector "b" coupled also to the collector of the second transistor Q13 for maintaining the predetermined currents from the collectors of each of the commonly driven source transistors Q15a, c, and d, and Q15b.

A circuit comprised of resistors R29, R10, and R11 and diodes D1 and D2 is coupled to the first terminal 10 and the second terminal 12 and is also coupled to the bases of the commonly driven source transistors Q15 and Q16, to insure that the regulator will begin to operate as soon as a voltage is applied to terminals 10 and 12.

The current regulator of FIG. 4 further includes a second plurality of commonly driven source transistors Q18, Q19, Q20, Q21 having their emitters coupled to the second terminal 12 and their bases coupled through resistance R14 to collector "a" of the source transistor Q15 for providing additional maintained predetermined currents from the collectors of all of the second plurality of source transistors, Q18, Q19, Q20 and Q21. The second source transistors are NPN transistors.

Figure 5:
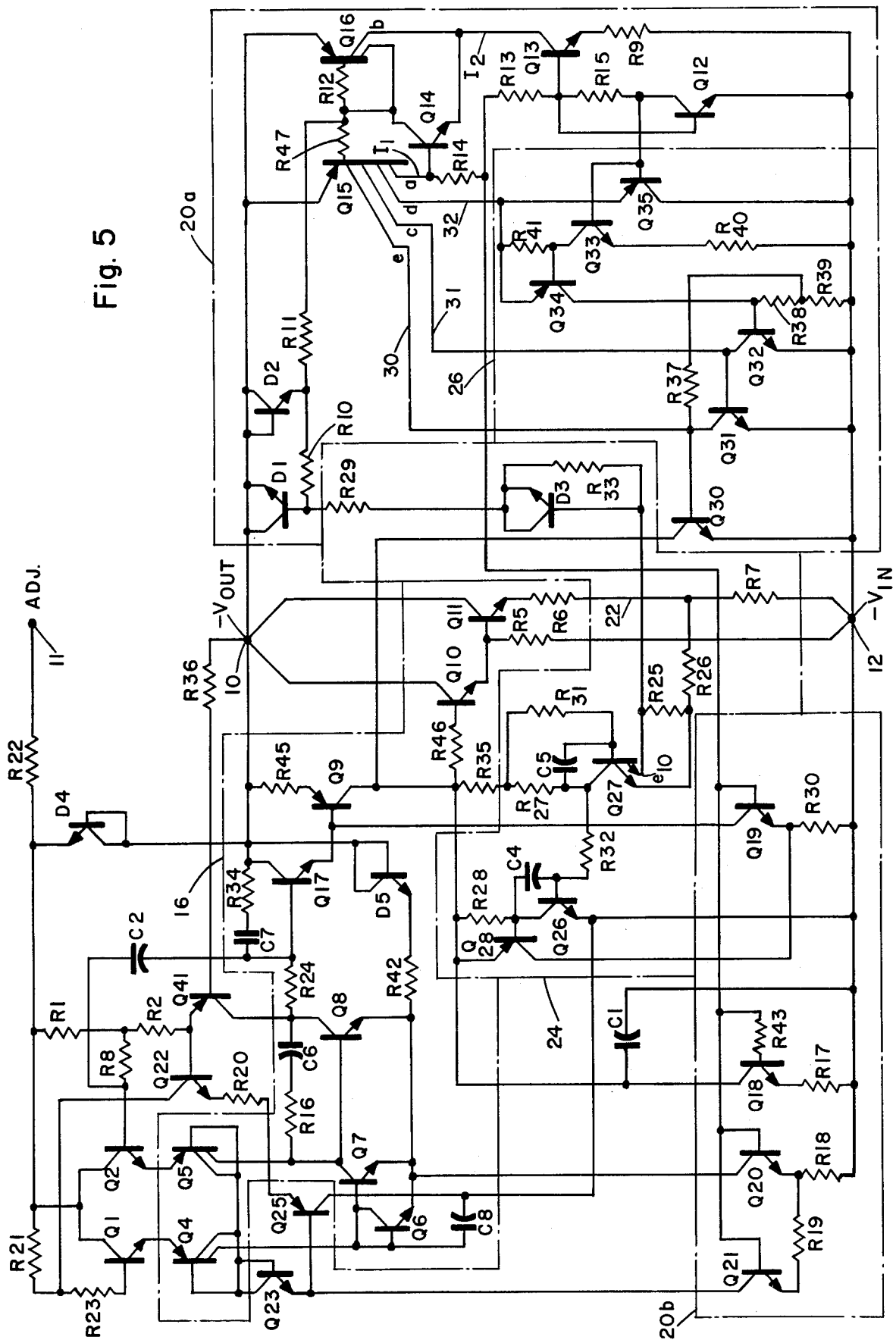
FIG. 5 is a schematic circuit diagram of a preferred embodiment of a negative voltage regulator according to the present invention, including a current regulator according to the present invention.

A preferred embodiment of a negative voltage regulator according to the present invention including the current regulator of the present invention is shown in FIG. 5. In the description of this embodiment, the same reference numerals are used to refer to components that are in common with the components included in the embodiments of FIGS. 1, 2, 3 and 4.

The negative voltage regulator of FIG. 5 includes a negative output voltage $(-V_{out})$ terminal 10, an adjustment terminal 11, a negative input voltage $(-V_{in})$ terminal 12, and a control circuit. The regulated negative output voltage $-V_{out}$ is provided at the terminal 10. The adjustment terminal 11 is for connection to a voltage source that is positively biased with respect to the negative output voltage terminal 10. The negative input voltage terminal 12 is for connection to a power source.

The control circuit is connected to the output terminal 10 and the adjustment terminal 11 for maintaining the voltage at the output terminal 10 at a level that differs from the voltage at the adjustment terminal 11 by a predetermined voltage difference.

The control circuit includes a resistive divider including resistances R1 and R2 coupled between the output terminal 10 and the adjustment terminal 11; a pair of NPN transistors Q1 and Q2 and a high-gain amplifier circuit 16.

The pair of NPN transistors Q1 and Q2 have their collectors connected in common and their bases respectively coupled to the resistive divider R1, R2 to provide a portion of the voltage difference between the output terminal 10 and the adjustment terminal 11 across their bases. The two NPN transistors Q1 and Q2 are adapted for operating at different current densities for providing a predetermined ratio in current flow through the pair of NPN transistors Q1 and Q2 when the voltage difference between the output terminal 10 and the adjustment terminal 11 is the predetermined voltage difference.

Because of the difference in current density in the pair of NPN transistors Q1 and Q2, there is an inherent emitter to base voltage difference $\Delta V_{be}$ between the bases of the pair of NPN transistors Q1 and Q2 that is proportional to temperature.

A PNP transistor Q41 having a negative temperature coefficient is connected in series with the resistive divider R1, R2 between the adjustment terminal 11 and the output terminal 10 for balancing the positive temperature coefficient of the voltage difference $\Delta V_{be}$ of the pair of NPN transistors Q1, Q2.

The pair of PNP transistors Q4, Q5 have their bases connected in common and their emitters respectively connected to the emitters of the pair of NPN transistors Q1, Q2. The pair of PNP transistors Q4, Q5 are adapted for operating at the same current density.

The third NPN transistor Q6 has its collector connected to one of the collectors of the PNP transistor Q4 that is connected to the NPN transistor Q1 of the pair of NPN transistors Q1, Q2 that has the greater current density. The third NPN transistor Q6 has its base connected to its collector.

The fourth NPN transistor Q7 has its collector connected to one of the collectors of the PNP transistor Q5 that is connected to the NPN transistor Q2 of the pair of NPN transistors Q1, Q2 that has the lesser current density. The fourth NPN transistor Q7 has its base connected to the collector of the third NPN transistor Q6. The second collectors of the PNP transistors Q4 and Q5 are connected to each other and to the bases of transistors Q4 and Q5.

The fifth NPN transistor Q8 has its base connected to the collector of the fourth NPN transistor Q7 and its emitter connected to the emitter of the fourth NPN transistor Q7.

The sixth NPN transistor Q17 has its base coupled through a resistance R24 to the collector of the fifth NPN transistor Q8, and its collector connected to the output terminal 10.

The third PNP transistor Q9 has its base connected to the emitter of the sixth NPN transistor Q17 and its emitter coupled through resistance R45, to the output terminal 10.

A biasing circuit including diode D5 and resistance R42 is connected to the output terminal 10 for biasing the emitters of the third, fourth and fifth NPN transistors Q6, Q7, Q8 in common in relation to the output terminal 10 for enabling a current flow through the third PNP transistor Q9 that is proportional to the difference in current flow through the pair of PNP transistors Q4, Q5.

The output stage including NPN Darlington-connected transistors Q10 and Q11 is coupled between the output terminal 10 and the input terminal 12 and to the collector of the third PNP transistor Q9 for amplifying the current through the third PNP transistor Q9 to drive the output terminal 10 to a maintained voltage level at which the current flow through the pair of NPN transistors Q1, Q2 is at the predetermined current ratio and the voltage difference between the output terminal 10 and the adjustment terminal 11 is the predetermined voltage difference.

The base of NPN transistor Q10 is coupled to the collector of the third PNP transistor Q9 through a resistance R46, and the base of the NPN transistor Q11 is connected to the emitter of the NPN transistor Q10. The emitter of the NPN transistor Q10 is coupled to the input terminal 12 through a resistance R5; and the emitter of the transistor Q11 is coupled to the input terminal 12 through resistances R6 and R7. The collectors of the transistors Q10 and Q11 are connected to the output terminal 10.

The emitter of the transistor Q2 is larger than the emitter of the transistor Q1 by a factor of between 4 and 10 so that there will be balanced current flow through the two transistors Q1 and Q2 when the voltage difference between the terminals 10 and 11 equals a predetermined voltage difference, such as 1.25 volts. When the voltage difference between the terminals 10 and 11 varies from the predetermined voltage difference, there is unequal current flow in the emitters of the transistors Q1 and Q2, whereby an error signal is provided between the emitter terminals of the transistors Q1 and Q2 to indicate a variation from the predetermined voltage difference in the voltage difference between the terminals 10 and 11.

To illustrate the operation of the high-gain amplifier circuit 16, consider the situation wherein the regulated negative output voltage at terminal 10 becomes less negative with respect to the potential at terminal 11 because of an increase in a load (not shown) connected to the terminal 10. When the voltage difference between terminals 10 and 11 decreases, the voltage at the base of the transistor Q2 rises thereby causing an imbalance in the current flow from the emitters of transistors Q1 and Q2 to the emitters of transistors Q4 and Q5 respectively. The current from the emitter of transistor Q2 rises and the current from the emitter of transistor Q1 drops thereby unbalancing the loop containing transistors Q1, Q2, Q4, and Q5. Current flow through transistor Q7 follows current flow through the transistor Q4. Thus when the current flow in transistor Q4 decreases the current flow in transistor Q7 decreases, thereby causing an increase of current flow in the transistor Q8. This results in decreased current flow in the transistor Q17 and the level of the amplified error signal at the emitter of transistor Q17 decreases, (i.e. becomes more negative with respect to the potential of the terminal 10).

When the amplified error signal from the emitter of transistor Q17 to the base of PNP transistor Q9 decreases, current flow through the PNP transistor Q9 increases and thereby causes an increase in the current flow through the output stage transistors Q10 and Q11 from terminal 10 to terminal 12. The output stage transistors Q10 and Q11 amplify the variation in current flow through the PNP transistor Q9 caused by the variation in the amplified error at the emitter of transistor Q17.

The increased current flow through the output stage transistors Q10 and Q11 causes the voltage at the negative output voltage terminal 10 to become more negative with respect to adjustment terminal 11 to thereby cause the voltage difference between terminals 10 and 11 to be the same as the predetermined voltage difference. While the voltage difference between the terminals 10 and 11 remains at the predetermined voltage difference, there is no variation in the amplified error signal at the emitter of transistor Q17 and the current flow between the terminals 10 and 12 remains constant.

The preferred embodiment of the negative voltage regulator of the present invention includes several components that are provided to assure good dynamic response and stability.

A feed forward capacitor C2 is connected between the base of the transistor Q2 and the base of the transistor Q17 in the high-gain amplifier circuit 16 to improve speed and stability. A capacitor C1 is connected between the collector of the third PNP transistor Q9 and the input terminal 12 to provide high frequency stability.

A current regulator circuit 20a, 20b is connected to terminals 10 and 12 to provide and maintain predetermined operating currents for the voltage regulator. The current regulator circuit 20a, 20b includes a transistor pair Q12 and Q13; a current defining resistance R9; a control transistor Q14; a first source transistor Q15 having a plurality of commonly driven collectors a, e, c and d; a commonly driven transistor Q16 having a collector b; and a plurality of commonly driven second source transistors Q18, Q19, Q20 and Q21. Transistors Q12, Q13, Q14, Q18, Q19, Q20 and Q21 are NPN transistors; and transistors Q15, and Q16 are PNP transistors.

The first transistor Q12 of the pair has its emitter connected to the input terminal 12 and its base connected to its collector. The second transistor Q13 of the pair has its base connected to the collector of the first transistor Q12. The first transistor Q12 is adapted for operating at a greater current density than the second transistor Q13, whereby there is a predetermined voltage difference $\Delta V_{be}$ between the emitters of the transistor pair Q12, Q13.

The current defining resistance R9 is connected between the emitter of the second transistor Q13 and the input terminal 12 for defining a predetermined current through the second transistor Q13 proportional to the predetermined voltage difference $\Delta V_{be}$.

The control transistor Q14 has its collector coupled to the bases of the source transistors Q15 and Q16, its emitter connected to the collector of the second transistor Q13, and its base biased with respect to the input terminal 12 for controlling the base currents of the source transistors Q15 and Q16. The bases of Q15 and Q16 are also coupled to the startup circuit comprised of resistors R7, R26, R25, R33, R29, R10, R11, and diodes D1 and D2.

Collector "b" of the source transistor Q16 is coupled to the collector of the second transistor Q13 for maintaining the predetermined current from all of the collectors a, b, c, d, and e of the source transistors Q15 and Q16.

The second plurality of commonly driven source transistors Q18, Q19, Q20, Q21 have their emitters coupled to the input terminal 12 and their bases coupled through resistance R14 to collector "a" of the source transistor Q15 for providing additional maintained predetermined currents from the collectors of all of the second plurality of source transistors Q18, Q19, Q20 and Q21.

The emitter of transistor Q13 is several times larger than the emitter of transistor Q12; and the current $I_1$ through collector "b" of transistor Q15 is comparable to the current $I_2$ through the transistor Q13. Both the current $I_1$ and the current $I_2$ are stable versus the negative input voltage provided at terminal 12, and are nominally proportional to absolute temperature so that various positive and negative current sources of various sizes larger of smaller than $I_1$ can be provided from the remaining collectors of the first source transistor Q15 or from the second source transistors Q18, Q19, Q20 and Q21. Such source currents do not change appreciably with variations in the voltages $-V_{out}$ and $-V_{in}$ at terminals 10 and 12 respectively.

The bases of transistors Q18, Q19, Q20 and Q21 are all coupled to the collector "b" of source transistor Q15 through resistance R14. The emitters of the transistors Q18, Q19, Q20 and Q21 are coupled to the terminal 12 through resistances R17, R30, and R18 and R19 respectively. The collector of the transistor Q18 provides a stable current source to the collector of the transistor Q9 in the high-gain amplifier circuit 16. The collector of the transistor Q19 provides a stable current source to the emitter of transistor Q17 in the high-gain amplifier circuit 16. The collector of the transistor Q20 provides a stable current source to the emitters of transistors Q6, Q7 and Q8 in the high-gain amplifier circuit 16.

The collector of the transistor Q41 is connected to the collector of the transistor Q8 to provide a current source to the high-gain amplifier circuit 16 at a voltage level above that appearing at the negative output voltage terminal 10.

The preferred embodiment of the negative voltage regulator of the present invention is stable with respect to variations in temperature. The temperature compensating effects of the transistor Q41 have been discussed hereinabove. In addition, there is a temperature curvature compensating circuit including PNP transistor Q25, NPN transistors Q22 and Q23, and resistance R20 coupled to the adjustment terminal 11 and to the high-gain amplifier circuit 16 for maintaining the current at the adjustment terminal 11 relatively constant versus temperature.

The emitter of the transistor Q23 and the base of transistor Q25 are connected to a stable current source at the collector of transistor Q21 in the current regulator 20a, 20b. The base and collector of the transistor Q23 are connected in common to the base of the transistor Q4 in the high-gain amplifier circuit 16. The collector of the transistor Q25 is connected to terminal 12. The emitter of transistor Q25 is connected through the resistor R20 to the emitter of the transistor Q22. The collector of transistor Q22 is connected to the reference voltage terminal 11 through resistances R21 and R22. The collector of transistor Q22 is also connected to the base of transistor Q1 through the resistance R23. The base of transistor Q22 is connected to the emitter of transistor Q41.

The base to emitter junction voltages $\Delta V_{be}$ of the transistors Q1, Q4, Q22, Q23, Q25 and Q41 all decrease with an increase in temperature and increase with a decrease in temperature.

An example setting forth the operation of this temperature curvature compensating circuit follows. Considering a situation where the temperature decreases, the voltage at the emitter of transistor Q1 falls 2 mv/°C.; the voltage at the base of the transistor Q4 falls 4 mv/°C.; and the voltage emitter of the transistor Q25 falls 4 mv/°C. The base of transistor Q41 being connected to the negative output voltage terminal 10 remains constant with the change in temperature. However, the voltage at the emitter of the transistor Q41 and the base of the transistor Q22 connected thereto both rise 2 mv/°C. Thus the voltage at the emitter of the transistor Q22 at the upper end of the resistance R20 remains constant. Since the voltage at the emitter of transistor Q25 on the lower side of the resistance R20 falls 4 mv/°C., as the temperature decreases, more current flows through the resistance R20 and the transistor Q22 to the adjustment terminal 11 so as to keep the current at the terminal 11 constant with respect to temperature.

The preferred embodiment of the negative voltage regulator of the present invention further includes a circuit 24 connected to the high-gain amplifier circuit 16 and to the terminals 10 and 12 for sensing the current flow from the terminal 10 to the terminal 12 and for limiting this current flow to a value that decreases as $V_{out} - V_{in}$ increases. The circuit 24 includes NPN transistors Q19, Q26, and Q27, PNP transistor Q28, resistances R7, R25, R26, R27, R28, R29, and R30, resistances R31, R32 and R33, zener diode D3, and capacitors C4 and C5.

The emitter of current source transistor Q19 is coupled to terminal 12 through the resistance R30; and the collector of source transistor Q19 is connected to the base of the transistor Q9. The emitter of the transistor Q26 is connected to the input terminal 12 and the collector of the transistor Q26 is connected to the base of the transistor Q28, which in turn is coupled to the emitter of transistor Q28 through the resistance R28. The emitter of the transistor Q28 is connected to both the collector of the transistor Q9 and the collector of current source transistor Q18. The collector of transistor Q27 is coupled through resistance R32 to the base of transistor Q26, and through resistances R27 and R35 to the collector of transistor Q9. The base of the transistor Q27 is coupled through resistance R31 and a resistance R27 to its own collector. A single first emitter of the transistor Q27 is coupled through a resistance R26 to output line 22 from the output stage transistor Q11 at the junction of resistance R6 and sense resistance R7. The transistor Q27 also has ten additional emitters $e_{10}$ coupled through a parallel combination of the zener diode D3 and the resistance R33 and further through the resistance R29 and the zener diode D1 to the terminal 10. These ten emitters $e_{10}$ are also connected through the resistance R25 in series with the resistance R26 to the line 22.

The sense resistance R27 is approximately 0.4 ohms. The current flowing from the terminal 10 to the terminal 12 is sensed by sensing the voltage across the sense resistance R7. When this current flow increases, the voltage across the sense resistance R7 increases and the voltage levels at the emitters and collector of the transistor Q27 increases. This in turn increases current flow through the transistor Q26 and causes current to begin flowing through the transistor Q28. When current flows through the transistor Q28, current flow through the transistor Q19 ceases. When transistor Q19 is turned off any further increase in current flow through the transistor Q9 and accordingly also through the output stage transistors Q10 and Q11 is thereby limited.

When the quantity $V_{out} - V_{in}$ increases, the current flow through the resistance R29 and the resistance R25 increases, thereby causing current flow through the ten emitters $e_{10}$ of the transistor Q27 to cease. This also results in decreased current flow through the transistor Q9 and accordingly limits the current flow through the output stage transistors Q10 and Q11 from the terminal 10 to the terminal 12, to a lower value than when $V_{out} - V_{in}$ was smaller.

The preferred embodiment of the negative voltage regulator of the present invention also includes a circuit 26 for detecting a high temperature in the voltage regulator circuit, and for shutting off the power to the negative output voltage terminal 10 when a predetermined temperature level is sensed.

The circuit 26 includes NPN transistors Q30, Q31, Q32 and Q33, PNP transistors Q34, and Q35 and resistances R37, R38, R39, R40, and R41. The transistor Q30 has its collector connected to the collector of the transistor Q9 and its emitter connected to the input terminal 12. The base of the transistor Q30 is connected via line 30 to collector "e" of the transistor Q15 and also to the collector of the transistor Q31. The transistor Q31 has its emitter connected to the input terminal 12 and its base connected to collector "c" of transistor Q15 via line 31 and also to the collector of the transistor Q32. The transistor Q32 has its emitter connected to the input terminal 12 and its base coupled to the base of Q30 via resistances R37 and R38. The base of the transistor Q32 is also coupled to the terminal 12 via the resistances R38 and R39. The base of the transistor Q32 is further connected to the collector of the transistor Q34, which in turn has its emitter connected to collector "d" of the transistor Q15 via line 32. The base of the transistor Q34 is connected to the collector of the transistor Q33. The transistor Q33 has its emitter coupled to the input terminal 12 through the resistance R40 and its collector coupled through resistance R41 and line 32 to collector "d" of transistor Q15. The base of the transistor Q33 is connected to the collector of the transistor Q12, as is the base of the transistor Q35. Transistor Q35 has its collector connected to the terminal 12 and its emitter connected to collector "d" of the transistor Q15 via line 32. The emitter of the transistor Q35 provides a bias voltage for the emitter of the transistor Q34.

When the temperature of the transistor Q33 rises to a predetermined temperature level, the current through the transistor Q33 increases to the point where the transistor Q34 is turned on, thereby turning on transistor Q32. This turns off transistor Q31, which causes transistor Q30 to be turned on. When the transistor Q30 is turned on, the current from the collector of transistor Q9 is drawn directly to the input terminal 12, thereby shutting off the output transistors Q10 and Q11 and shutting off the output power to the output terminal 10.

The values of the resistance and capacitance components in the circuit of FIG. 5 are as follows:

| RESISTANCES (ohms) | |
|---|---|
| R1 | 2 K |
| R2 | 20 K |
| R5 | 250 |
| R6 | 0.15 |
| R7 | 0.04 |
| R8 | 500 |
| R9 | 600 |
| R10 | 100 K |
| R11 | 60 K |
| R12 | 750 |
| R13 | 1 K |
| R14 | 4 K |
| R15 | 270 |
| R16 | 5 K |
| R17 | 2.4 K |
| R18 | 500 |
| R19 | 6 K |
| R20 | 15 K |
| R21 | 110 |
| R22 | 60 |
| R23 | 2.5 K |
| R24 | 2 K |
| R25 | 150 |
| R26 | 10 |
| R27 | 390 |
| R28 | 6.6 K |
| R29 | 18 |
| R30 | 499 |
| R31 | 12 K |
| R32 | 15 K |
| R33 | 100 K |
| R34 | 800 |
| R35 | 12 K |
| R36 | 30 |
| R37 | 20 K |
| R38 | 8 K |
| R39 | 4 K |
| R40 | 4.3 K |
| R41 | 12.4 K |
| R42 | 680 |
| R43 | 12 K |
| R45 | 220 |
| R46 | 100 |
| R47 | 100 |
| CAPACITANCES | |
| C1 | 57 pf |
| C2 | 15 pf |
| C4 | 5 pf |
| C5 | 2 pf |
| C6 | 15 pf |
| C7 | 25 pf |
| C8 | 1.8 pf |

Diodes D2, D4 and D5 are NPN transistors having their base and collector terminals connected in common in the same manner as transistor Q6. Zener diodes D1 and D3 are NPN transistors having their collector and emitter terminals connected in common.

In an integrated circuit embodiment of the negative voltage regulator of the present invention thermal gradients and transients are optimally distributed by placing the emitters of certain groups of functionally cooperating transistors about common centers of distribution. Center of distribution is defined in U.S. Pat. No. 3,995,304 to Robert A. Pease, a co-inventor herein.

Figure 6:
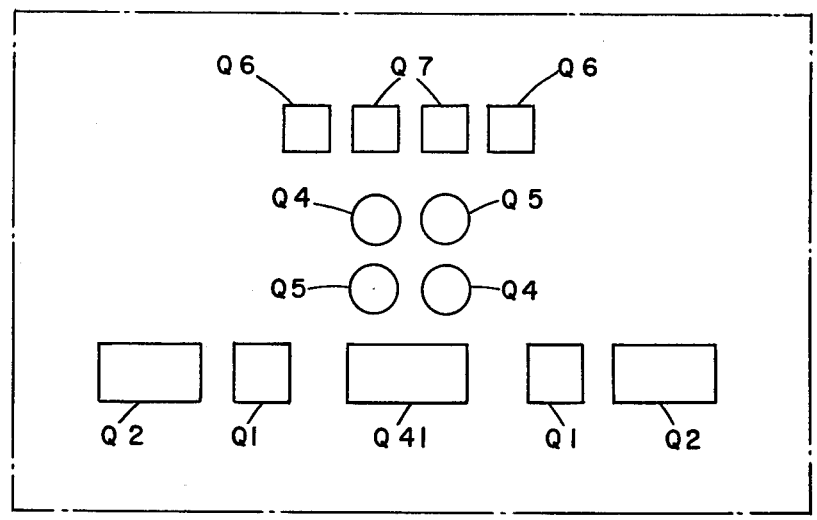
FIG. 6 illustrates the physical placement of the emitters of certain groups of functionally cooperating transistors in an integrated circuit embodiment of the circuit of FIG. 5 so as to provide optimum thermal transient and gradient rejection.

Referring to FIG. 6, the emitters of certain ones of the transistors that functionally cooperate with one another are divided into two separate regions, and each emitter region of a common transistor is identified by the same reference symbol, e.g. Q2. The emitters in certain groups of transistors are placed about common centers of distribution with respect to each other. For example, in the group consisting of transistors Q1, Q2 and Q41, all three are centered about the emitter of transistor Q41. The emitters of transistors Q4 and Q5 have a common center of distribution by means of quad-cross coupling. Quad-cross coupling refers to a configuration wherein four transistors are positioned in a quadrangular arrangement with the diagonally opposite transistors being connected in parallel so that the net effect is the same as having two transistors. The emitters of transistors Q6 and Q7 are disposed so that the emitters of Q7 have a common center of distribution between the emitters of the transistor Q6.

Figure 7:
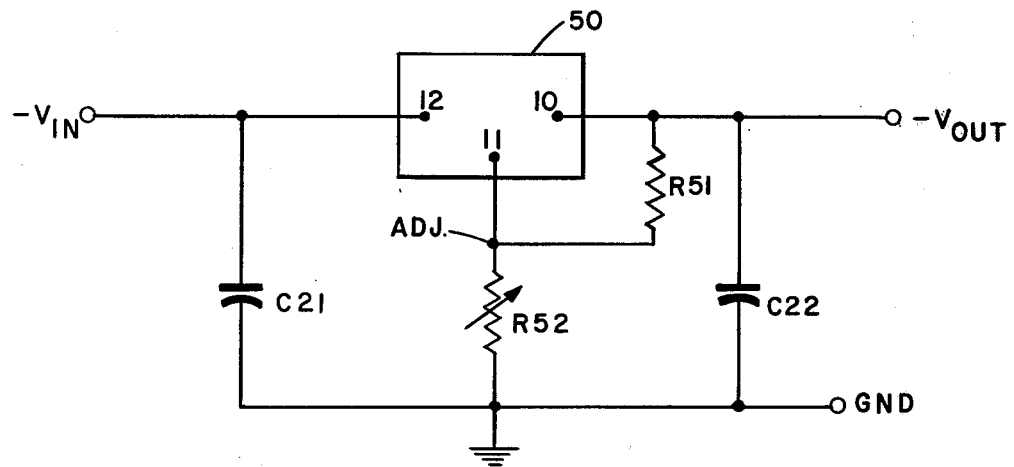
FIG. 7 is a schematic circuit diagram showing the use of the negative voltage regulator of FIG. 5 as an adjustable voltage regulator.

The negative voltage regulator of the present invention is useful as an adjustable negative voltage regulator, as shown in FIG. 7. The circuit of FIG. 5 is contained within an integrated circuit package 50. The negative input voltage terminal 12 is connected to a negative voltage source $-V_{in}$. The negative output voltage terminal 10 is connected to a terminal $-V_{out}$ for providing the regulated negative output voltage. An input capacitor C21 is connected between the terminal 12 and circuit ground; and an output capacitor C22 is connected between the terminal 10 and circuit ground. A resistive divider including resistance R51 and variable resistance R52 is connected between the terminal 10 and circuit ground.

The adjustment terminal 11 is connected to the junction of the resistances R51 and R52. With the circuit of FIG. 7, $-V_{out}=V_{ref}(1+R52/R51)$.

The values of the components used in the circuit of FIG. 7 are as follows:

| | |
|---|---|
| C21 | 1 f |
| C22 | 1 f |
| R51 | 120 ohms |
| R52 | 5 ohms |
| $-V_{ref}$ | $-1.25$ volts |
| $-V_{in}$ typically is rated at $-40$ volts. | |

Having described our invention, we now claim:

1. A voltage regulator comprising:
an output terminal for providing an output voltage;
an adjustment terminal; and
a control circuit connected to the output terminal and the adjustment terminal for maintaining the voltage at the output terminal at a level that differs from the voltage at the adjustment terminal by a predetermined voltage difference;
characterized by the control circuit comprising:
a resistive divider coupled between the output terminal and the adjustment terminal;
a pair of transistors having their collectors connected in common and their bases respectively coupled to the resistive divider to provide a portion of said voltage difference between the output terminal and the adjustment terminal across said bases, wherein the two transistors are adapted for operating at different circuit densities for providing a predetermined ratio in current flow through the pair of transistors when the voltage difference between the output terminal and the adjustment terminal is said predetermined voltage difference; and
a high-gain amplifier circuit connected to the emitters of the pair of transistors and to the output terminal for driving the output terminal to a maintained voltage level at which said current flow through the pair of transistors is at said predetermined current ratio and the voltage difference between the output terminal and the adjustment terminal is said predetermined voltage difference.

2. A voltage regulator according to claim 1, wherein, because of said difference in current density in the pair of transistors, there is an inherent emitter to base voltage difference $\Delta V_{be}$ between the bases of the pair of transistors that is proportional to temperature, characterized by:
a device having a negative temperature coefficient connected in series with the resistive divider between the adjustment terminal and the output terminal for balancing the positive temperature coefficient of the voltage difference $\Delta V_{be}$ of the pair of transistors.

3. A voltage regulator according to claim 2, wherein the device having a negative temperature coefficient is a third transistor having a base to emitter voltage with a negative temperature coefficient, and the emitter and base of the third transistor are connected in series with the resistive divider.

4. A voltage regulator according to claim 2, characterized by the voltage regulator consisting of an integrated circuit in which the pair of transistors and the device having a negative temperature coefficient have a common center of distribution.

5. A voltage regulator according to claim 1, characterized by:
the pair of transistors being NPN transistors; and
the high-gain amplifier circuit including
a pair of PNP transistors having their bases connected in common and their emitters respectively connected to the emitters of the pair of NPN transistors, wherein the pair of PNP transistors are adapted for operating at the same current density; and
an amplifier connected to the collectors of the pair of PNP transistors for amplifying the difference in the current flow in the pair of PNP transistors to drive the output terminal to said maintained voltage level.

6. A voltage regulator according to claim 5, characterized by the amplifier including:
a third NPN transistor having its collector connected to the collector of the PNP transistor that is connected to the NPN transistor of the pair of NPN transistors that has the greater current density, and its base connected to its collector;
a fourth NPN transistor having its collector connected to the collector of the PNP transistor that is connected to the NPN transistor of the pair of NPN transistors that has the lesser current density, and its base connected to the collector of the third NPN transistor;

a fifth NPN transistor having its base coupled to the collector of the fourth NPN transistor, and its emitter connected to the emitter of the fourth NPN transistor;

a third PNP transistor having its base coupled to the collector of the fifth NPN transistor and its emitter coupled to the output terminal;

circuit means connected to the output terminal for biasing the emitters of the third, fourth and fifth NPN transistors in common in relation to the output terminal for enabling a current flow through the third PNP transistor that is proportional to the difference in current flow through the pair of PNP transistors;

an input terminal for connection to a power source; and an output stage connected between the output terminal and the input terminal and to the collector of the third PNP transistor for amplifying the current through the third PNP transistor to drive the output terminal to said maintained voltage level.

7. A voltage regulator according to claim 6, further comprising:

a capacitance connected between the collector of the third PNP transistor and the input terminal for providing high frequency stability.

8. A voltage regulator according to claim 6, wherein, because of said difference in current density in the pair of NPN transistors, there is an inherent emitter to base voltage difference $\Delta V_{be}$ between the bases of the pair of transistors that is proportional to temperature, characterized by:

a device having a negative temperature coefficient connected in series with the resistive divider between the output terminal and the adjustment terminal for balancing the positive temperature coefficient of the voltage difference $\Delta V_{be}$ of the pair of transistors.

9. A voltage regulator according to claim 8, characterized by the voltage regulator consisting of an integrated circuit in which the pair of NPN transistors and the device having a negative temperature coefficient have a common center of distribution, the pair of PNP transistors have a common center of distribution, and the third and fourth NPN transistors have a common center of distribution.

10. A voltage regulator according to claim 6, characterized by the voltage regulator consisting of an integrated circuit in which the pair of NPN transistors have a common center of distribution, and the pair of PNP transistors have a common center of distribution.

11. A voltage regulator according to claim 1, characterized by the voltage regulator consisting of an integrated circuit in which the pair of transistors have a common center of distribution.

12. A voltage regulator according to claim 1, characterized by a current regulator for maintaining a plurality of predetermined currents for the voltage regulator, said current regulator comprising:

first and second terminals for connection across a voltage source;

a plurality of commonly driven source transistors having their bases coupled in common and their emitters coupled to the first terminal;

a second transistor pair wherein the first transistor of the second pair has its emitter connected to the second terminal and its base connected to its collector, and the second transistor of the second pair has its base connected to the collector of the first transistor, and the first transistor is adapted for operating at a greater current density than the second transistor, whereby there is a predetermined voltage difference $\Delta V_{be}$ between the emitters of the second transistor pair;

a current defining resistance connected between the emitter of the second transistor and the second terminal for defining a predetermined current through the second transistor proportional to said predetermined voltage difference $\Delta V_{be}$; and a control transistor having its collector coupled to the bases of the commonly driven source transistors, its emitter connected to the collector of the second transistor and its base biased with respect to either the first or second terminal for controlling the base current of the commonly driven source transistors;

wherein one of the source transistors has its connector coupled to the collector of the second transistor for maintaining said predetermined currents from the collectors of each of the commonly driven source transistors.

13. A voltage regulator according to claim 12, wherein the plurality of commonly driven source transistors are PNP transistors, the second transistor pair are NPN transistors, and the control transistor is an NPN transistor.

14. A voltage regulator according to claim 12, characterized by further comprising:

a second plurality of commonly driven source transistors having their emitters coupled to the second terminal and their bases coupled to a collector of one of the first mentioned source transistors for providing additional maintained predetermined currents from the collectors of all of the second source transistors.

15. A voltage regulator according to claim 14, wherein the first plurality of commonly driven source transistors are PNP transistors, the second transistor pair are NPN transistors, the control transistor is an NPN transistor, and the second plurality of commonly driven source transistors are NPN transistors.

16. A current regulator, for maintaining a plurality of predetermined currents, characterized by:

first and second terminals for connection across a voltage source;

a plurality of commonly driven source transistors having their emitters coupled to the first terminal;

a transistor pair wherein the first transistor of the pair has its emitter connected to the second terminal and its base connected to its collector, and the second transistor of the pair has its base connected to the collector of the first transistor, and the first transistor is adapted for operating at a greater current density than the second transistor, whereby there is a predetermined voltage difference $\Delta V_{be}$ between the emitters of the transistor pair;

a current defining resistance connected between the emitter of the second transistor and the second terminal for defining a predetermined current through the second transistor proportional to said predetermined voltage difference $\Delta V_{be}$; and a control transistor having its collector coupled to the bases of the commonly driven source transistors, its emitter connected directly to the collector of the second transistor and its base biased with respect to either the first or second terminal for controlling the base current of the commonly driven source transistors;

wherein one of the source transistors has its collector coupled to the collector of the second transistor for maintaining said predetermined currents from the collectors of each of the commonly driven source transistors.

17. A current regulator according to claim 16, wherein the plurality of commonly driven source transistors are PNP transistors, the transistor pair are NPN transistors, and the control transistor is an NPN transistor.

18. A current regulator according to claim 16, characterized by further comprising:
a second plurality of commonly driven source transistors having their emitters coupled to the second terminal and their bases coupled to a collector of one of the first mentioned source transistors for providing additional maintained predetermined currents from the collectors of all of the second source transistors.

19. A current regulator according to claim 18, wherein the first plurality of commonly driven source transistors are PNP transistors, the transistor pair are NPN transistors, the control transistor is an NPN transistor, and the second plurality of commonly driven source transistors are NPN transistors.

20. A voltage regulator comprising:
an output terminal for providing an output voltage;
an adjustment terminal; and
a control circuit connected to the output terminal and the adjustment terminal for maintaining the voltage at the output terminal at a level that differs from the voltage at the adjustment terminal by a predetermined voltage difference;
characterized by the control circuit comprising:
a resistive divider and a series-connected lateral PNP transistor coupled between the output terminal and the adjustment terminal;
a pair of NPN transistors having their bases respectively coupled to the resistive divider to provide a portion of said voltage difference between the output terminal and the adjustment terminal across said bases, wherein the two transistors are adapted for operating at different current densities for providing a predetermined ratio in current flow through the pair of NPN transistors when the voltage difference between the output terminal and the adjustment terminal is said predetermined voltage difference; and
a high-gain amplifier circuit connected to the pair of transistors and to the output terminal for driving the output terminal to a maintained voltage level at which said current flow through the pair of transistors is at said predetermined current ratio and the voltage difference between the output terminal and the adjustment terminal is said predetermined voltage difference;
wherein, because of said difference in current density in the pair of transistors, there is an inherent emitter to base voltage difference $\Delta V_{be}$ between the bases of the pair of transistors that is proportional to temperature, and
wherein the PNP transistor has a negative temperature coefficient for balancing the positive temperature coefficient of the voltage difference $\Delta V_{be}$ of the pair of transistors.

* * * * *